US011320495B2

(12) United States Patent
Dase et al.

(10) Patent No.: US 11,320,495 B2
(45) Date of Patent: May 3, 2022

(54) CURRENT-BASED DIRECTIONAL ELEMENT IN A POWER DELIVERY SYSTEM

(71) Applicant: Schweitzer Engineering Laboratories, Inc., Pullman, WA (US)

(72) Inventors: Kanchanrao Gangadhar Dase, Pullman, WA (US); Mohammed Shabbir Pithapur, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 41 days.

(21) Appl. No.: 16/557,480

(22) Filed: Aug. 30, 2019

(65) Prior Publication Data
US 2021/0063460 A1  Mar. 4, 2021

(51) Int. Cl.
| *H02H 3/38* | (2006.01) |
| *G01R 31/58* | (2020.01) |
| *H02H 7/22* | (2006.01) |
| *H02H 1/00* | (2006.01) |
| *H02J 13/00* | (2006.01) |
| *G01R 31/50* | (2020.01) |

(52) U.S. Cl.
CPC ............ *G01R 31/58* (2020.01); *G01R 31/50* (2020.01); *H02H 1/0007* (2013.01); *H02H 3/382* (2013.01); *H02H 7/22* (2013.01); *H02J 13/0006* (2013.01)

(58) Field of Classification Search
CPC .......... H02H 3/382; H02H 7/22; G01R 31/58; G01R 31/50; H01H 1/0007
See application file for complete search history.

(56) References Cited

U.S. PATENT DOCUMENTS

| 4,188,573 | A | * | 2/1980 | Gyugyi | ................. | H02J 3/1864 |
| | | | | | | 323/210 |
| 4,297,740 | A | | 10/1981 | Hagberg | | |
| 4,600,961 | A | | 7/1986 | Bishop | | |
| 4,812,995 | A | * | 3/1989 | Girgis | ..................... | H02H 3/40 |
| | | | | | | 324/512 |
| 5,883,578 | A | | 3/1999 | Roberts | | |
| 6,573,726 | B1 | | 6/2003 | Roberts | | |
| 6,833,711 | B1 | | 12/2004 | Hou | | |

(Continued)

FOREIGN PATENT DOCUMENTS

WO    2014/018909    1/2014

OTHER PUBLICATIONS

Pradhan, A.K.; "Fault Direction Estimation in Radial Distribution System Using Phase Change in Sequence Control"; IEEE Transactions on Power Delivery; Oct. 2007, pp. 2065-2071. (Year: 2007).*

(Continued)

*Primary Examiner* — Harry R Behm
(74) *Attorney, Agent, or Firm* — Fletcher Yoder, P.C.; Bradley W. Schield

(57) ABSTRACT

Systems and methods may be used to determine fault types and/or directions even during a loss of potential by receiving, at one or more processors, an indication of a pre-fault power flow direction for a power delivery system. The one or more processors then determine a fault direction during a fault for the power delivery system using current vector angles and the pre-fault power flow direction.

23 Claims, 10 Drawing Sheets

(56) References Cited

U.S. PATENT DOCUMENTS

| | | | |
|---|---|---|---|
| 7,720,619 | B2 | 5/2010 | Hou |
| 7,945,400 | B2 | 5/2011 | Hou |
| 8,289,668 | B2 | 10/2012 | Kasztenny |
| 9,160,158 | B2 | 10/2015 | Schweitzer |
| 9,250,282 | B2 | 2/2016 | Ukil |
| 9,366,715 | B2 | 6/2016 | Ukil |
| 9,413,156 | B2 | 8/2016 | O'Brien |
| 9,568,516 | B2 | 2/2017 | Gubba Ravikumar |
| 10,340,684 | B2 | 7/2019 | Sridharan |
| 2005/0057212 | A1 | 3/2005 | Harbaugh |
| 2005/0231871 | A1 | 10/2005 | Karimi |
| 2005/0288884 | A1* | 12/2005 | Sutrave .............. G01R 35/00 702/106 |
| 2007/0055889 | A1 | 3/2007 | Henneberry |
| 2008/0158750 | A1* | 7/2008 | Premerlani .......... H02H 7/30 361/63 |
| 2008/0211511 | A1 | 9/2008 | Choi |
| 2009/0009180 | A1* | 1/2009 | Varghai ............. H02H 3/081 324/521 |
| 2011/0035065 | A1* | 2/2011 | Schweitzer, III ...... H02J 3/06 700/286 |
| 2011/0075304 | A1 | 3/2011 | Hamer |
| 2012/0068717 | A1 | 3/2012 | Gong |
| 2012/0330582 | A1 | 12/2012 | Wiszniewski |
| 2013/0107405 | A1 | 5/2013 | Blumschein |
| 2013/0221977 | A1* | 8/2013 | Ukil .................. G01R 31/08 324/522 |
| 2014/0028116 | A1 | 1/2014 | O'Brien |
| 2014/0104735 | A1* | 4/2014 | Vanhala ............. H02H 1/0007 361/85 |
| 2015/0124358 | A1 | 5/2015 | Hulse |
| 2016/0041216 | A1 | 2/2016 | Tang |
| 2016/0091537 | A1 | 3/2016 | Gaarder |
| 2016/0266193 | A1 | 9/2016 | Ennis |
| 2016/0299187 | A1 | 10/2016 | Liang |
| 2016/0308349 | A1 | 10/2016 | Sridharan |
| 2019/0317143 | A1 | 10/2019 | Dase |

OTHER PUBLICATIONS

William O'Brien, et al. "Catching Falling Conductors in Midair—Detecting and Tripping Broken Distribution Circuit Conductors at Protection Speeds" Presented at the 42nd Annual Western Protective Relay Conference, Oct. 2015.

Abhisek Ukil, et al. "Current-Only Directional Overcurrent Protection for Distribution Automation: Challenges and Solutions", IEEE Transactions on Smart Grid vol. 3, Issue: 4, pp. 1687-1694, Dec. 2012.

Abhisek Ukil, et al. "Current-Only Directional Overcurrent Relay," in IEEE Sensors Journal, vol. 11, No. 6, pp. 1403-1404, Jun. 2011.

Abhisek Ukil, et al. "Smart distribution protection using current-only directional overcurrent relay," 2010 IEEE PES Innovative Smart Grid Technologies Conference Europe (ISGT Europe), Gothenberg, Oct. 2010, pp. 1-7.

Abhisek Ukil "Detection of direction change in prefault current in current-only directional overcurrent protection," IECON 2016—42nd Annual Conference of the IEEE Industrial Electronics Society, Florence, Italy, Oct. 2016.

M. M. Eissa, "Evaluation of a new current Directional Protection technique using field data," in IEEE Transactions on Power Delivery, vol. 20, No. 2, pp. 566-572, Apr. 2005.

\* cited by examiner

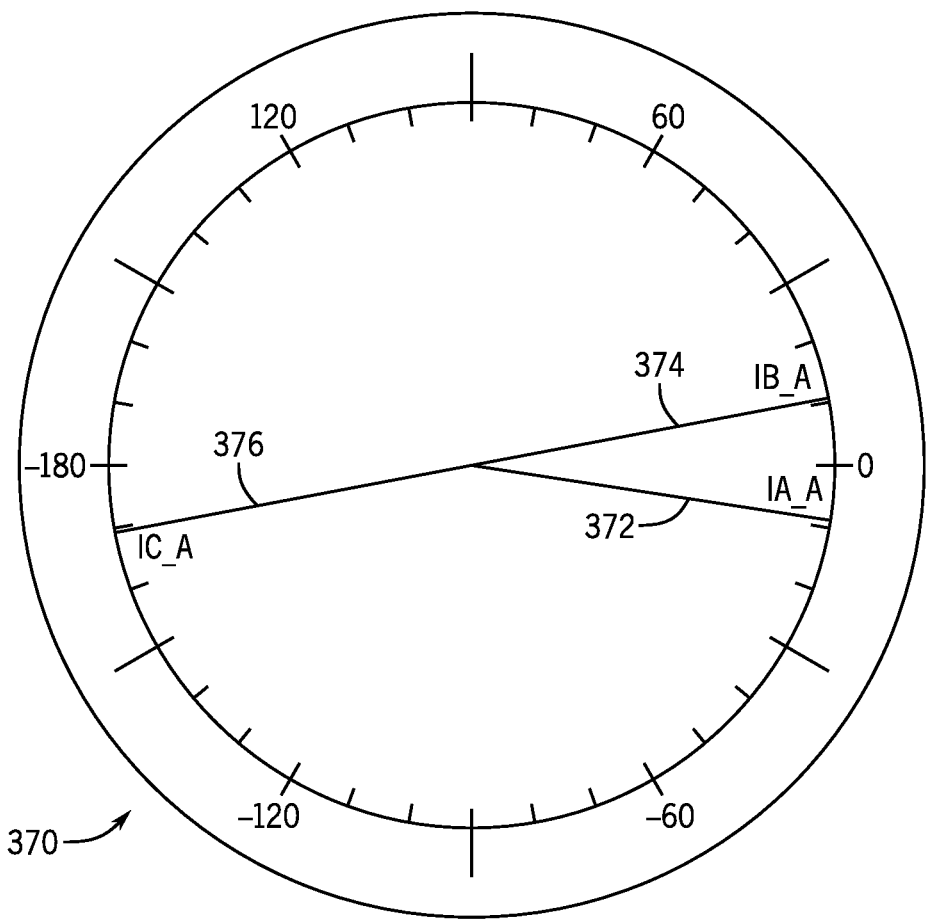
FIG. 12
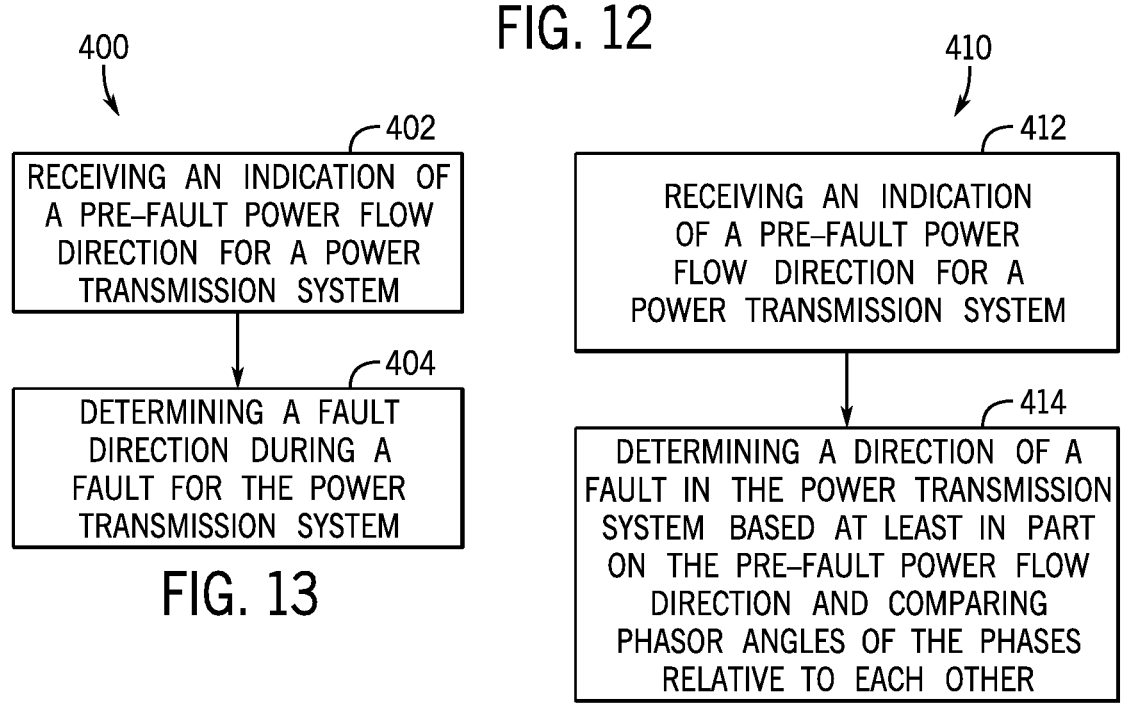
FIG. 13
FIG. 14

CURRENT-BASED DIRECTIONAL ELEMENT IN A POWER DELIVERY SYSTEM

BACKGROUND

This disclosure relates to a directional element in a power delivery system. More particularly, this disclosure relates to determining a direction of faults on power lines based on current.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Power lines may be used to provide electrical energy from a source (such as, for example, a utility source, a generator, a distributed generator, or the like) to one or more loads. To conduct electricity between the source and the loads, power lines may include one or more conductors that are installed on overhead structures or buried underground. Due to aging and/or environmental conditions, such as wind, rain, animals, or vehicles, faults on power lines may occur in which power may not be delivered to the loads as desired. Relays, faulted circuit indicators, and other intelligent electronic devices may be used to determine a direction of a fault. However, some techniques that determine a direction of the fault may be impractical and/or impossible during a loss of potential condition on one or more of the power line phases.

BRIEF DESCRIPTION OF THE DRAWINGS

FIG. 12 is a phasor diagram of a power delivery system to be analyzed to determine whether a fault is a forward fault or a reverse fault, in accordance with an embodiment;

FIG. 13 is a flow diagram of a process for determining a fault direction for a power delivery system, in accordance with an embodiment;

FIG. 14 is a flow diagram of a process for determining a fault direction for line-line faults or line-line-ground faults in a power delivery system, in accordance with an embodiment;

DETAILED DESCRIPTION

Figure 1:
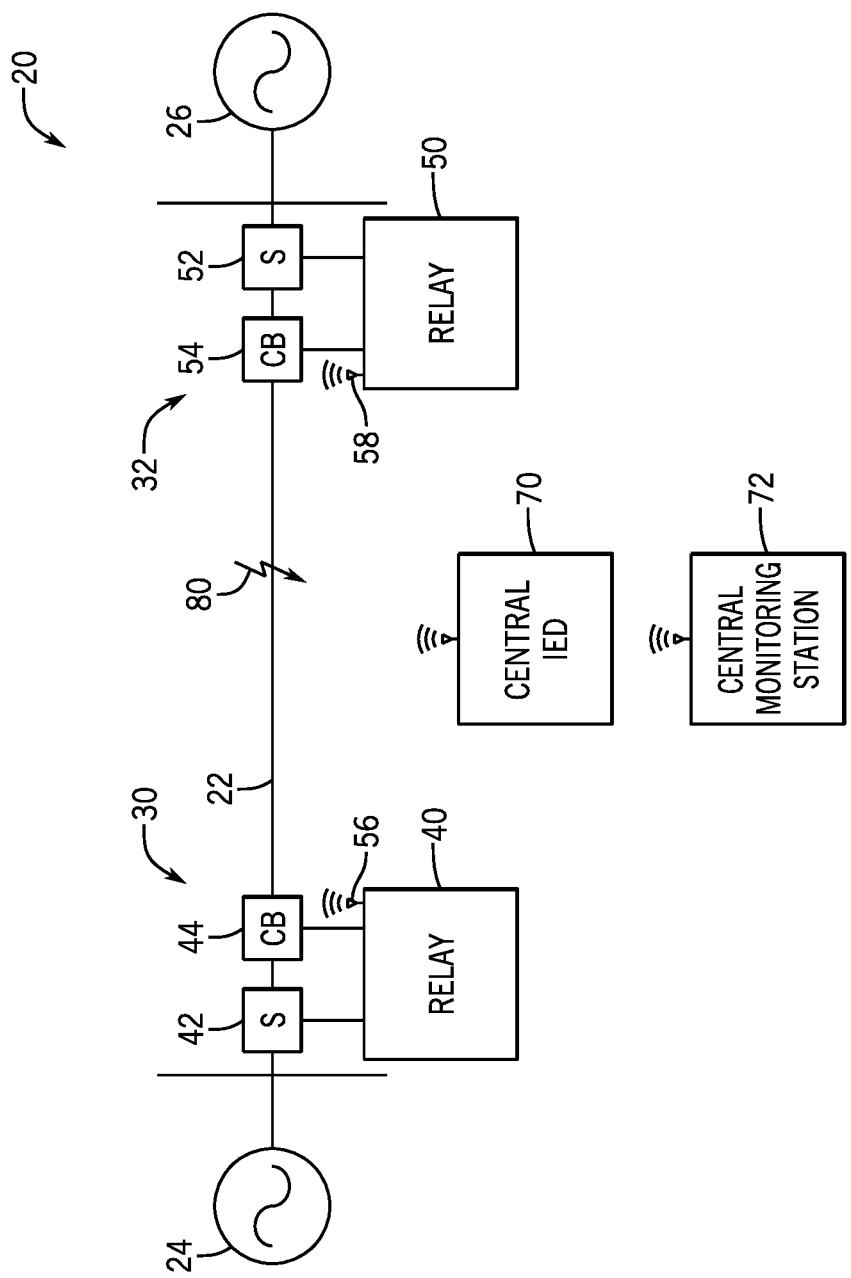
FIG. 1 illustrates a block diagram of an embodiment of an electric power delivery system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Power lines may be used to provide electrical energy from a source (such as, for example, a utility source, a generator, a distributed generator, or the like) to one or more loads as part of a power delivery system and/or power distribution system. To conduct electricity between the source and the loads, power lines may include one or more conductors that are installed on overhead structures or buried underground.

Due to aging and/or environmental conditions, such as wind, rain, animals, or vehicles, faults on power lines may occur in which power may not be delivered to the loads as desired.

Relays, faulted circuit indicators, and other electronic devices may be used to determine the direction of the fault. The direction of the fault may be used in various ways during operation of the power system. For example, the fault direction may be used by the electronic devices like relays in tripping logic to determine whether to trip the line breakers.

Furthermore, in power delivery system, directional elements may be based on single-ended measurements and may be are derived from voltages and currents to aid in identifying the fault directions. However, under loss of potential (LOP) conditions where the relay loses at least one phase voltage, a directional element may not be able to determine direction of the fault and/or flow of power. Because of such LOP conditions, the relay may entirely depend on non-directional overcurrent elements on occurrence of a fault. Some relay panels may utilize a 4-pole miniature circuit breaker instead of phase-isolated high rupturing capacity (HRC) fuses for the voltage circuitry before they terminate on the relay power delivery block. With such designs, the probability of LOP conditions where the relay losses all the three phases is increased. To address such conditions, the relay may attempt to detect a direction of the fault regardless of whether voltages are applied to the relay. If the direction of the fault can be determined with no voltages applied to the relay, the relay may trip the circuit breaker reliably. To achieve this directional determination, the relay may include a directional element to determine a direction of the fault based only on currents. As may be appreciated, this directional element may be used in a variety of applications in distribution systems, such as in fault circuit indicators, fast bus-bar schemes in distribution boards, or other applications in distribution systems.

FIG. 1 illustrates a block diagram of a power delivery system 20, in accordance with an embodiment. The power delivery system 20 may be any suitable power delivery system 20, such as a three-phase power delivery system. Although the one-line block diagram is used as a simplified example, the systems and methods disclosed herein may be used in conjunction with any suitable power delivery system. As used herein, a power deliver system may include a power transmission system and/or a power delivery system, a power distribution system, radial power distribution systems, bi-directional power systems, or the like. The power delivery system 20 may generate, transmit, and distribute electric energy to loads. Electric power delivery systems (e.g., the power delivery system 20) may include various types of equipment, such as electric generators, power transformers, power delivery lines, circuit breakers, busses, loads, and the like. A variety of other types of equipment may also be included in power delivery system 20, such as voltage regulators, capacitor banks, and the like. In the illustrated embodiment, the power delivery system 20 includes a power line 22 that transfers electrical energy from a first power generator 24 (e.g., local power generator) and a second power generator 26 (e.g., remote power generator) to one or more loads.

The power delivery system 20 may be monitored, controlled, automated, and/or protected using protection systems 30 and 32. The protection systems 30 and 32 may each include one or more intelligent electronic devices (IEDs), such as a local relay 40 and a remote relay 50. For example, the IEDs may be used to monitor equipment of many types, including electric delivery lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment. Note that, as used herein, the local relay 40 may refer to the relay that is determining the direction of the fault.

As used herein, an IED (such as the local relay 40 and the remote relay 50) may refer to any microprocessor-based device that monitors, controls, automates, and/or protects monitored equipment within the power delivery system 20. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system that includes multiple IEDs.

A common time signal may be distributed throughout the power delivery system 20. Utilizing a common or universal time source may enable the IEDs to generate time synchronized data. In various embodiments, relays 40 and 50 may receive the common time signal. The common time signal may be distributed in the power delivery system 20 using a communications network or using a common time source, such as a Global Navigation Satellite System ("GNSS"), or the like.

According to various embodiments, the local relay 40 and the remote relay 50 may use communication circuitries 56 and 58 to communicate with each other, with one or more other IEDs 70, and/or with a central monitoring station 72. In some embodiments, the local relay 40 and the remote relay 50 may communicate with the IED 70 and/or the central monitoring station 72 directly or via a communication network. The central monitoring station 72 may include one or more of a variety of types of systems. For example, central monitoring station 72 may include a supervisory control and data acquisition (SCADA) system and/or a wide area control and situational awareness (WACSA) system. The local relay 40 and the remote relay 50 may communicate over various media such as direct communication or over a wide-area communications network.

Network communication may be facilitated by networking devices including, but not limited to, multiplexers, access points, routers, hubs, gateways, firewalls, and switches. In some embodiments, IEDs and network devices may include physically distinct devices. In other embodiments, IEDs and network devices may be composite devices, or may be configured in a variety of ways to perform overlapping functions. IEDs and network devices may include multi-function hardware (e.g., processors, computer-readable storage media, communications interfaces, etc.) that may be utilized to perform a variety of tasks that pertain to network communications and/or to operation of equipment within the power delivery system 20.

As explained below, the local relay 40 and/or the remote relay 50 may monitor the electrical characteristics of power on the power line 22 via sensor circuitry 42 and 52. Each of the local relay 40 and the remote relay 50 may be communicatively coupled to a respective circuit breaker 44 and 54. Upon occurrence of a fault 80, the local relay 40, the remote relay 50, the other IED 70, and/or the central monitoring station 72, may effect a control operation on the power delivery system 20, such as opening the local circuit breaker 44 and/or opening the remote circuit breaker 54.

Figure 2:
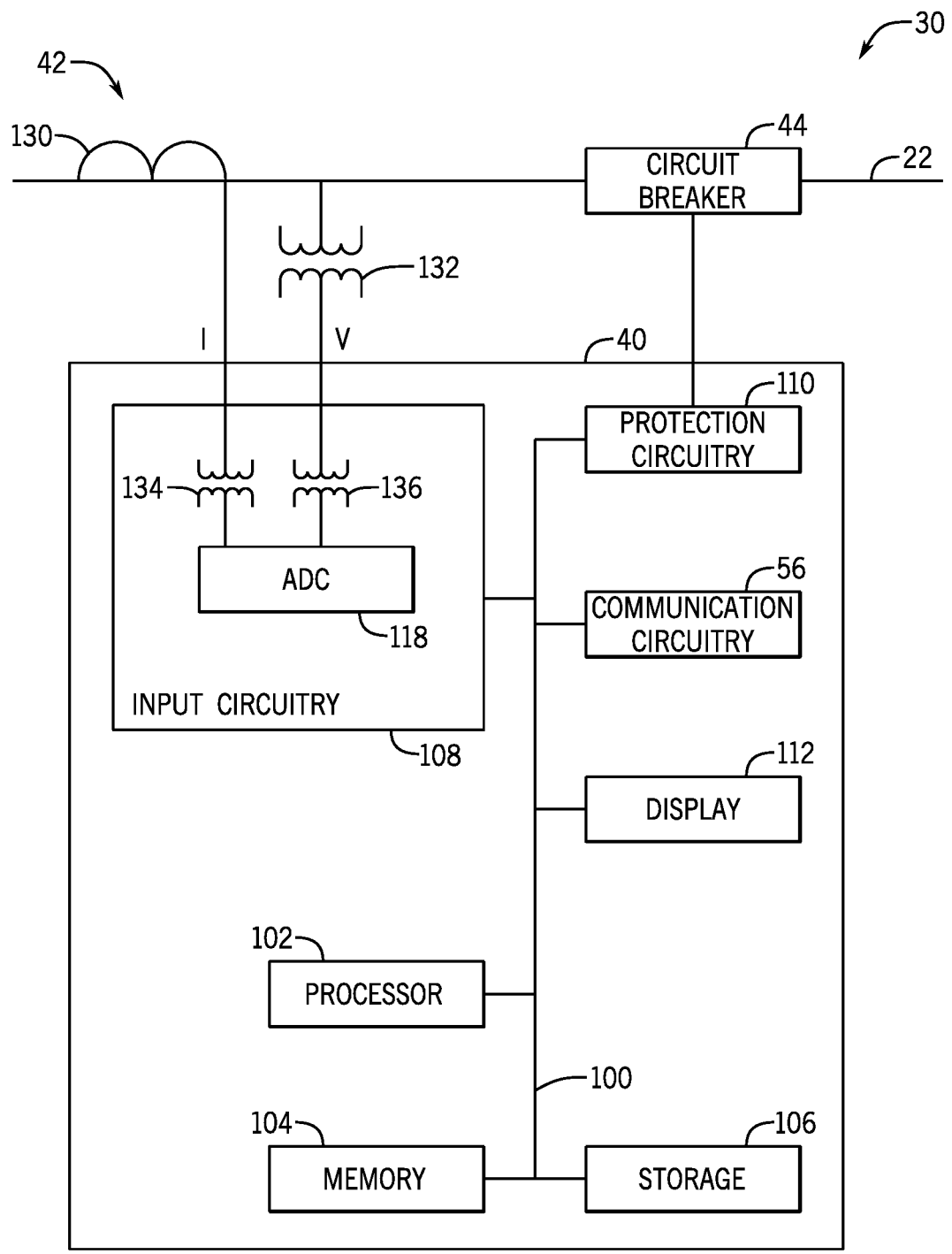
FIG. 2 is a block diagram of a protection system of the electric power delivery system of FIG. 1, in accordance with an embodiment.

FIG. 2 illustrates a block diagram of the protection system 30 that may be used to determine a direction of a fault and/or effect a control operation on the power delivery system 20. In the illustrated embodiment, the protection system 30 includes the local relay 40, the sensor circuitry 42, and the circuit breaker 44. The local relay 40 may include a bus 100 connecting a processor 102 or processing unit(s) to a memory 104, a computer-readable storage medium 106, input circuitry 108, protection circuitry 110, and one or more displays 112. In some embodiments, the processor 102 may include two or more processors. The computer-readable storage medium 106 may include or interface with software, hardware, or firmware modules for implementing various portions of the systems and methods described herein. The computer-readable storage medium 106 may be the repository of one or more modules and/or executable instructions to implement any of the processes described herein. In some embodiments, the computer-readable storage medium 106 and the modules therein may all be implemented as hardware components, such as via discrete electrical components, via a Field Programmable Gate Array ("FPGA"), and/or via one or more Application Specific Integrated Circuits ("ASICs").

The processor 102 may process inputs received via the input circuitry 108 and/or the communication circuitry 56. The processor 102 may operate using any number of processing rates and architectures. The processor 102 may perform various algorithms and calculations described herein using computer-executable instructions stored on computer-readable storage medium 106. In some embodiments, the processor 102 may be embodied as a microprocessor, a general purpose integrated circuit, an ASIC, a FPGA, and/or other programmable logic devices.

The sensor circuitry 42 may include a current transformer 130 and/or a voltage (e.g., potential) transformer 132. The input circuitry 108 may receive electric current signals and/or voltage signals from the current transformer 130 and the voltage transformer 132 respectively, transform the signals using respective potential transformer(s) 134 and 136 to a level that may be sampled, and sample the signals using, for example, A/D converter(s) 118 to produce digital signals representative of measured current and measured voltage on the power line. Similar values may also be received from other distributed controllers, station controllers, regional controllers, or centralized controllers. The values may be in a digital format or other format. In certain embodiments, the input circuitry 108 may be utilized to monitor current signals associated with a portion of a power delivery system 20. Further, the input circuitry 108 may monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, conductor sag and the like.

The A/D converter 118 may be connected to the processor 102 by way of the bus 100, through which digitized representations of current and voltage signals may be transmitted to the processor 102. As described above, the processor 102 may be used to monitor and/or protect portions of the power delivery system 20, and issue control instructions in response to the same (e.g., instructions implementing protective actions). The processor 102 may determine a direction of a fault on a power line 22 based on the digitized representations of the current and/or voltage signals.

The processor 102 may toggle a control operation on the power delivery system 20 via the protection circuitry 110. For example, the processor 102 may send a signal to control operation of the circuit breaker 44 to disconnect the power line 22 from the local generator 24. As illustrated, the local relay 40 may include the display 112 to display alarms indicating the direction of the fault to an operator. The communication circuitry 56 may include a transceiver to communicate with one or more other intelligent electronic devices and/or a central monitoring station, or the like. In some embodiments, the processor 102 may cause the transceiver to send a signal indicating the direction of the fault. For example, the processor 102 may send, via the transceiver of the communication circuitry 56, a signal indicating the direction of the fault to the central monitoring station 72. Further, the processor 102 may activate the alarms upon detection of the fault.

Figure 3:
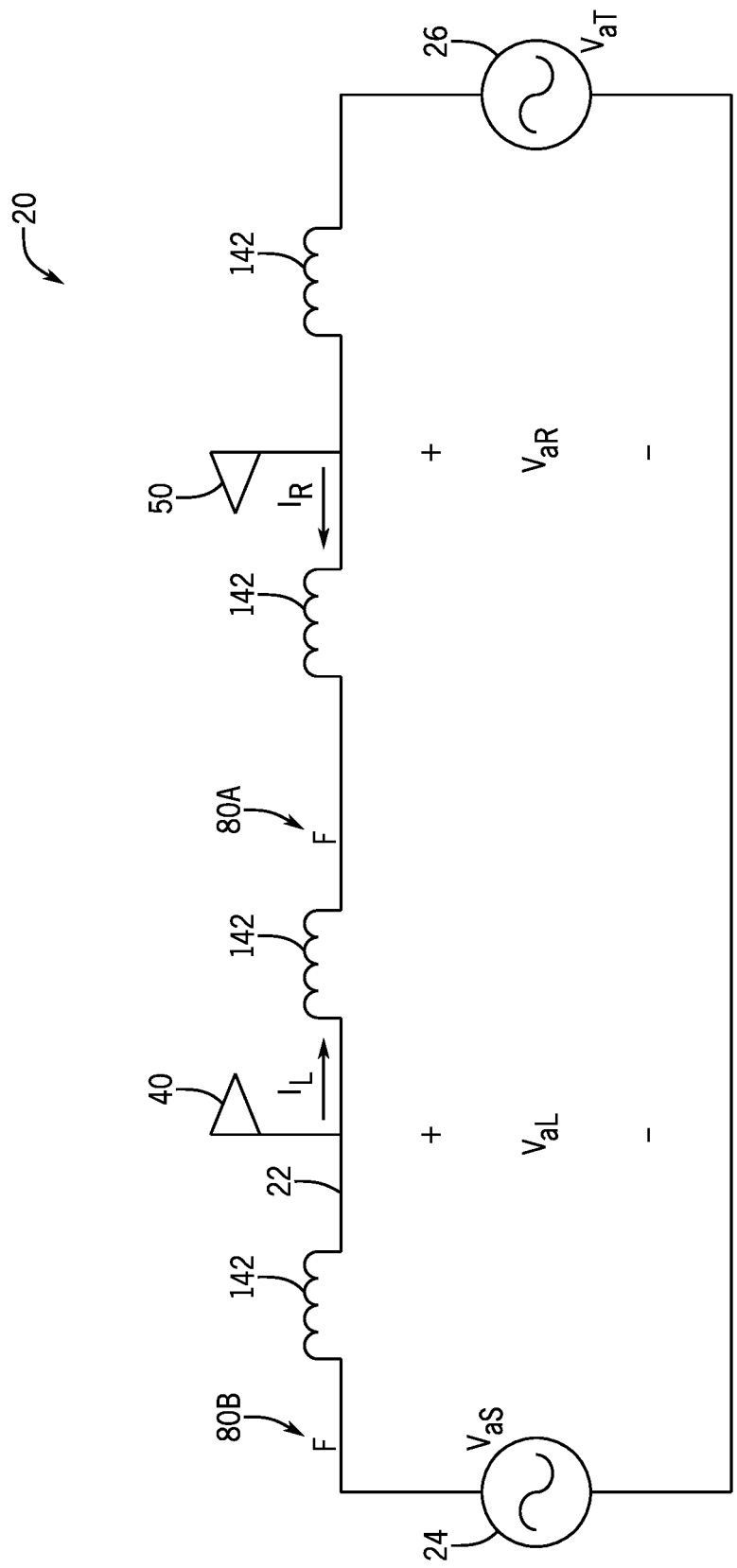
FIG. 3 is a single-phase representation of the power delivery system of FIG. 1, in accordance with an embodiment.

FIG. 3 illustrates a single-phase representation of the power delivery system 20 that includes the power line 22 electrically coupled between the local generator 24 and the remote generator 26. The local relay 40 is coupled to the power line 22 between the local generator 24 and the remote relay 50, and the remote relay 50 is coupled between the remote generator 26 and the local relay 40. The power line 22 has inductance and capacitance spread across the line due to the physical properties, referred to as line parameters, of the power line 22, such as the length of the power line 22, the proximity of the power line to other phase lines, and/or to the ground, and the like. In the illustrated embodiment, inductance (e.g., parasitic inductance) across the power line 22 is represented by inductors 142.

Various techniques may be used by the local relay 40, the remote relay 50, or a combination of both, to determine a direction of the fault 80. As described below, the fault 80 may be analyzed using symmetrical and/or asymmetrical component analysis to determine the direction of the fault 80 from the local relay 40 and/or the remote relay 50. For instance, the local relay 40 may utilize a measured current ($I_L$) and/or a measured voltage ($V_{aL}$) to determine whether the fault 80 is a forward fault 80A or a reverse fault 80B. Additionally or alternatively, similar determinations may be made using the remote relay 50 using a measured current ($I_R$) and/or a measured voltage ($V_{aR}$).

As illustrated below, power flow direction may be considered as positive/forward if the magnitude of the angle difference between the phase current and its respective phase voltage is less than 90°. Similarly, the power flow direction may be considered negative/reverse if the magnitude of the angle difference between phase current and its respective phase voltage is greater than 90°. When voltage inputs are available to the relay (e.g., local relay 40), it can readily estimate the power flow direction. Once a loss of potential (LOP) condition occurs where the relay loses all the phase voltages, the relay 40 or 50 may track current vectors to determine whether the power flow direction has changed from a pre-LOP condition.

When the load is constant, the change in the current vector angle is near negligible. However, if the power flow direction changes under loading conditions, the current vector angle change would increase or decrease by at least a large angle in all the three phases. This angle change is determined as per the load encroachment angle set by the user. In this way, even if all of the three phase voltages are lost, the power flow direction may be determined by tracking the change in the current vector angles and based at least in part on a known power flow direction before the loss of three phase voltages.

In distribution systems, at least some relays in the system may be devoid of phase voltage inputs. For instance, such feeders may function as radial feeders whose topology may change with time, and a user/administrator of the system expects the direction of the power flow to be positive before closing its respective breakers. An additional check may include monitoring a change in the active power flow in an incomer as soon as the feeder is energized. If the active power flow of the incomer increases, the direction is guaranteed to be forward. In some embodiments, energy meters may be installed in the outgoing feeders to verify the direction of power flow. Once the operator is sure about the direction of power flow, the operator may set the direction in the relay. For example, the operator may select a direction of flow using a push button or setting. The relay then starts monitoring the current vectors for change in power flow direction. Thus, using the previously indicated power flow direction, the direction of a fault may be determined even during LOP conditions by tracking the changes in the fault current angle for a certain time (e.g. 1.5 power system cycles).

Figure 4:
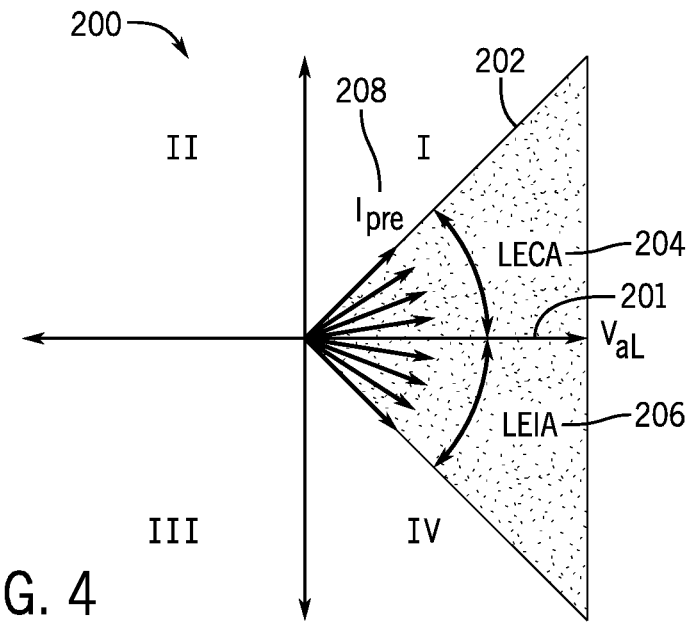
FIG. 4 is a graph of load encroachment angles for the power delivery system of FIG. 1, in accordance with an embodiment.

FIG. 4 illustrates a graph 200 of load encroachment angles for the power delivery system 20 for a forward power flow direction. An angle of 0° is at an axis 201 of the graph. As illustrated, a load encroachment area 202 defined by a load encroachment inductive angle (LEIA) 206 and a load encroachment capacitive angle (LECA) 204 that define how the power delivery system 20 may be loaded during operation. In some embodiments, the LEIA 206 and the LECA 204 may be defined by a user/administrator of the power delivery system 20. The LEIA 206 and the LECA 204 may have limitations placed on which defined values are possible to achieve the current-based direction determination discussed herein. For instance, the LEIA 206 and the LECA 204 may be limited to values that satisfy the following inequalities:

$$LEIA + LECA \leq 80°$$ (Inequality 1)

$$LEIA \leq -\frac{|\delta|}{2} + 80°,$$ (Inequality 2)

where δ is the maximum angle difference between the voltage of the local generator 24 and the voltage of the remote generator 26.

Figure 5:
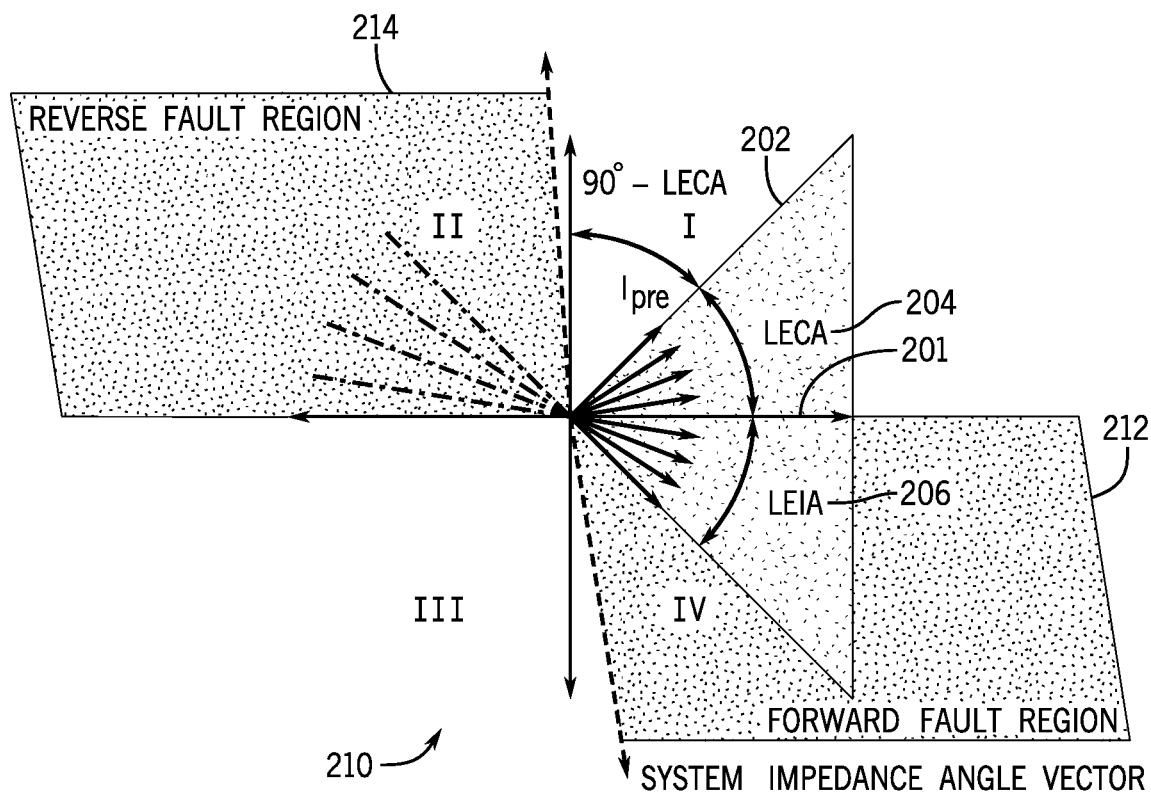
FIG. 5 is a graph for forward pre-fault power flow that includes the graph of FIG. 4 incorporating a forward fault region and a reverse fault region, in accordance with an embodiment.

FIG. 5 illustrates a graph 210 that is similar to the graph 200 while incorporating a forward fault region 212 and a reverse fault region 214. For forward faults occurring after a pre-fault load current in an LECA region above the axis 201 in the load encroachment area 202 the graph 210 may be analyzed. For a forward-bolted fault with solid connections, the current measured by the local relay 40 would lag the source voltage ($V_{AS}$) by an impedance angle formed from the local generator 24 to the fault 80A. The maximum decrease in the fault current angle as compared to the pre-fault current angle would be the LECA 204 plus the angle (e.g., 90°) of the impedance from the local generator 24 to the fault 80A. Such a decrease in the fault current angle rotates the angle in a clockwise manner from its pre-fault current vector ($I_{pre}$) in the LECA region into the forward fault region 212.

On the other hand, for a highly resistive forward fault (e.g., arc, tree downing power line, etc.), the current through the local relay 40 may or may not lag the pre-fault current vector by some angle, depending on the position of the pre-fault current vector in the LECA region.

For forward faults occurring after a pre-fault current vector was in an LEIA region below the axis 201 in the load encroachment area 202, the rotation within the graph 210 from the pre-fault current vector may be different than when the pre-fault current vector is in the LECA region. For instance, if a forward fault occurs the measured current at the local relay 40 would lag or lead the pre-fault current vector depending on the fault type (e.g., bolted or highly resistive faults). For a resistive forward fault, the maximum increase in the fault current angle as compared to the pre-fault current angle would be LEIA degrees causing any counter-clockwise rotation of the pre-fault current vector to remain in the forward fault region 212. For a bolted forward fault, the pre-fault current vector would start decreasing (e.g., rotating clockwise). The maximum such decrease would be limited by the system impedance vector angle (e.g., 90°) and the position of pre-fault current vector in the LEIA region. Therefore, such faults are forward faults due to the rotation remaining in the forward fault region 212.

Similar techniques may be applied to identify reverse faults for pre-fault current vectors in the LEIA region or the LECA region. For instance, for reverse bolted faults where the pre-fault current vector is in the LEIA region, the measured current at the local relay 40 may lag the voltage of the remote generator 26 by the impedance angle formed from the remote generator 26 to the fault 80B (e.g., 90°). For reverse faults, the current seen by the local relay 40 are out of phase compared to the primary fault current flowing in the circuit. The fault current angle as compared to the pre-fault current vector may increase or decrease depending on the fault resistance. If the angle starts decreasing, the minimum decrease in the fault current angle as compared to the pre-fault current would be 180° minus the LEIA degrees. However, if the fault current angle starts increasing, the minimum increase would be 180° minus the impedance angle from the remote generator 26 to the fault 80B (e.g., 90°). Either of these rotations, result in the fault current angle rotating the current vector into the reverse fault region 214.

If a pre-fault current vector is in the LECA region before a reverse fault occurs, a minimum increase by the fault current angle would be 180° minus the impedance angle from the remote generator 26 to the fault 80B (e.g., 90°) minus the LECA in degrees for the result arrive in the reverse fault region 214.

Figure 6:
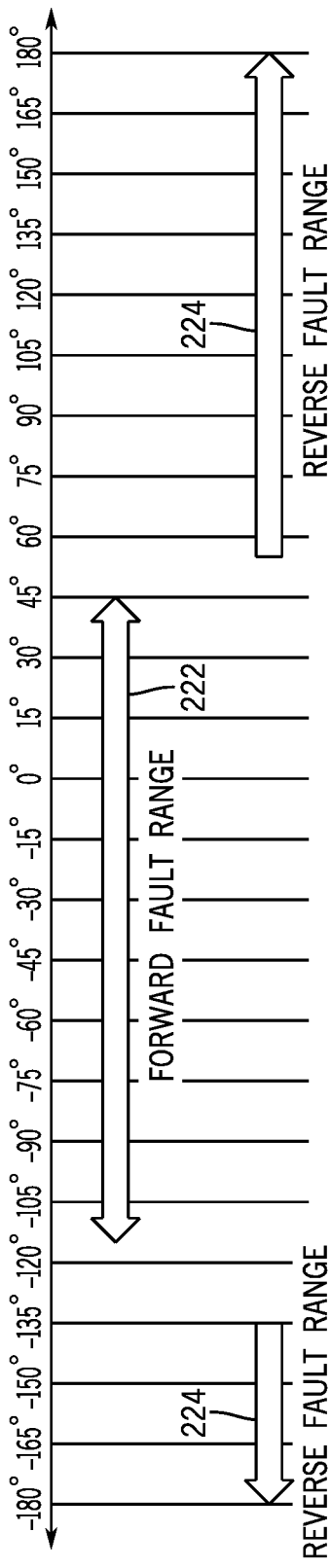
FIG. 6 is a scale derived from the graph of FIG. 5 that may be used to determine whether a fault is a forward fault or a reverse fault, in accordance with an embodiment.

Thus, direction of a fault current may be determined using the difference in the angles of pre-fault current and fault current vectors due to the isolation between the forward fault region 212 and the reverse fault region 214 created by imposing the restrictions indicated in inequalities 1 and 2. FIG. 6 represents a scale 220 derived from the graph 210 and that may be used for determining whether a fault is a forward fault or a reverse fault after pre-fault forward power flow. FIG. 6 uses example values LEIA=−45° and LECA=35° with a system impedance angle of 80°. However, other values may be used similarly to acquire similar graphs for respective values. In the graph 210, if an angle difference occurs in a forward fault range 222, the fault 80 is a forward fault. However, if the angle difference occurs in reverse fault ranges 224, the fault is a reverse fault.

For instance, Table 1 illustrates example actual and normalized current phasor data:

TABLE 1

Actual and Normalized Current Phasor Data (update rate = $\frac{1}{8}^{th}$ of power system cycle)

| IA_Mag | IA_Ang | IA_Ang_Stationary |
|---|---|---|
| 763.6932 | −31.5435 | 0.02218 |
| 761.8464 | 13.4343 | −0.02218 |
| 762.6932 | 58.45647 | 0.02217 |
| 743.5893 | 94.78284 | −8.67363 |
| 689.2351 | 144.6266 | 4.84376 |
| 1112.729 | −176.806 | −6.4325 |
| 1559.766 | −158.881 | −27.0748 |
| 1619.988 | −136.701 | −22.8202 |
| 1456.932 | −92.9508 | −1.24988 |
| 1909.462 | −38.1303 | 9.82052 |
| 2677.051 | −1.6054 | −8.475143 |
| 2849.927 | 31.80507 | −11.589527 |
| 2768.844 | 75.12057 | −1.6845 |
| 2815.702 | 120.6636 | 0.54303 |
| 2823.971 | 165.4175 | −0.2461 |
| 2808.824 | −149.253 | 0.3294 |
| 2812.269 | −103.636 | 0.6171 |
| 2838.388 | −58.2642 | 0.37178 |
| 2862.83 | −13.3907 | −0.12643 |

In Table 1, the last 16 samples correspond to two cycles after a fault. The first three samples show consistent normalized current phasor data indicative of a non-fault. At this point, the direction of power flow was forward. Summing the 16 samples of the normalized angles (IA_Ang_Stationary) together provides a value of the difference as −71.84°. As the current phasor data is processed every $\frac{1}{8}^{th}$ of a power system angle, the current phasor if steady is expected to rotate 45 degrees for each processing. IA_Ang_Stationary is formed by subtracting this expected angle rotation (45 degrees) for each processing. An angle difference of −71.84° on the scale 220 indicates that the fault direction is forward of the local relay 40. If the value had been between 55° and 180 or between −180° and −135°, the fault direction would be in the reverse direction of the local relay 40.

Figure 7:
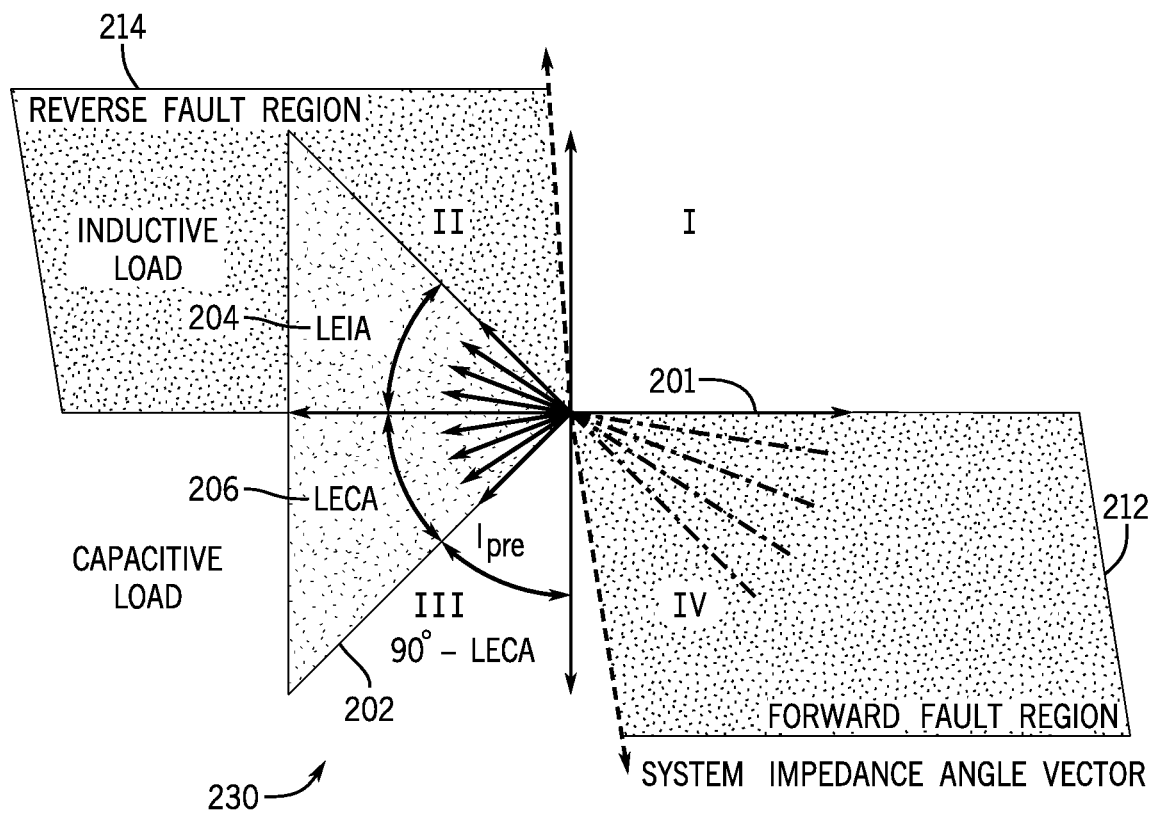
FIG. 7 is a graph for reverse pre-fault power flow incorporating a forward fault region and a reverse fault region, in accordance with an embodiment.

Similar evaluations may be performed on faults occurring when a reverse flow occurs before a fault. For instance, FIG. 7 illustrates a graph 230 that is similar to the graph 210 except that the load encroachment area 202 is located for a reverse flow direction.

For example, when a pre-fault vector is in the LECA region with a reverse flow of power and a reverse fault occurs at fault 80B, the current measured by the local relay 40 would lag the remote source voltage ($V_{aT}$) of the remote generator 26 by an impedance angle formed from the remote generator 26 to the fault 80B. The maximum decrease in the fault current angle as compared to the pre-fault current angle would be LECA plus the impedance angle (e.g., 85°-90°).

If a fault occurs in the reverse direction with a pre-fault reverse flow of power in the LEIA region, the current measured at the local relay 40 would lag or lead the pre-fault current vector depending if the fault is bolted or highly resistive. For a resistive fault, a maximum increase in the fault current angle as compared to the pre-fault current angle would be LEIA degrees. For a bolted reverse fault, the maximum decrease would be the angle of system impedance vector from the remote generator 26 to the fault 80B (e.g., 85° or 90°). Each of such movements, results in the fault current vector(s) being in the reverse fault region 214.

For any forward fault with a reverse power flow and current vector in the LECA region prior to the fault, the angle between pre-fault current vector and the fault current vector increases. The minimum increase would be 180° minus the system impedance from the local generator 24 to the fault 80A minus the LECA.

Movement of any forward fault from the LEIA region with reverse flow pre-fault depends on the type of the fault 80A. For instance, if a bolted fault occurs in the forward direction. The current through the local relay 40 would lag the voltage (Vas) of the local generator 24 by the impedance angle formed from the local generator 24 to the fault 80A. The fault current angle as compared to the pre-fault current angle may increase or decrease depending on the fault resistance. The minimum decrease in the fault current angle as compared to the pre-fault current would be 180° minus LEIA. Similarly, the minimum increase would be 180° minus the system impedance from the local generator 24 to the fault 80A (e.g., 90°).

Figure 8:
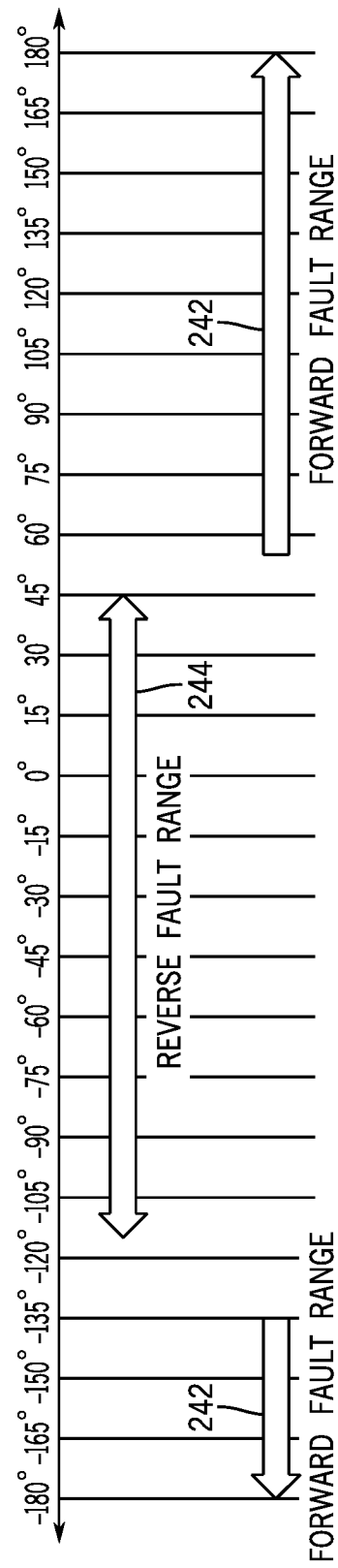
FIG. 8 is a scale derived from the graph of FIG. 7 that may be used to determine whether a fault is a forward fault or a reverse fault, in accordance with an embodiment.

Thus, using such information, a direction of fault may be determined using the difference in the angles of pre-fault current vector and the fault current vector. FIG. 8 represents a scale 240 derived from the graph 230 and that may be used for determining whether a fault is a forward fault or a reverse fault after pre-fault reverse power flow. Similar to FIG. 6, FIG. 8 uses example values LEIA=−45° and LECA=35° with a system impedance angle of 80°. In the graph 230, if an angle difference occurs in a forward fault range 242, the fault 80 is a forward fault 80A. However, if the angle difference occurs in reverse fault ranges 244, the fault is a reverse fault.

In some embodiments, when the pre-fault current angle and the normalized current angle during fault have the same value, the direction of fault current may be considered to be the same as the power flow direction prior to the fault.

As an example, Table 2 illustrates example actual and normalized current phasor data:

TABLE 2

Actual and Normalized Current Phasor Data (update rate = $\frac{1}{8}^{th}$ of power system cycle)

| IA_Mag | IA_Ang | IA_Ang_Stationary |
|---|---|---|
| 247.1124 | 137.0984 | 0.00833 |
| 247.1594 | −177.98 | −0.0785 |
| 246.8013 | −132.904 | 0.0759 |
| 619.4371 | −156.489 | −68.585 |
| 1504.402 | −173.592 | −62.1026 |
| 1898.594 | −162.63 | −34.0383 |
| 1500.039 | −95.3173 | 22.31278 |
| 3506.945 | −31.1282 | 19.18914 |
| 5501.849 | −1.49206 | −15.363881 |
| 5751.436 | 31.40299 | −12.104949 |
| 5521.149 | 84.74163 | 8.33864 |
| 6954.599 | 135.0509 | 5.30927 |
| 7704.224 | 176.1681 | −3.8828 |
| 7634.289 | −139.928 | −1.0958 |
| 7714.369 | −94.9006 | 0.02715 |
| 7556.356 | −50.7104 | −0.80988 |
| 7370.368 | −5.20323 | 0.507199 |
| 7368.89 | 40.4204 | 0.62631 |
| 7372.031 | 84.59829 | −0.82211 |

In Table 2, the last 16 samples correspond to two cycles after a fault. The first three samples show consistent normalized current phasor data indicative of a non-fault. At this point, the direction of power flow was reverse through the local relay 40. Summing the 16 samples of the normalized angles (IA_Ang_Stationary) together provides a value of the difference as −142.49751°. An angle difference of −142.49751° on the scale 240 indicates that the fault direction is forward of the local relay 40. If the value had been between −115° and 45°, the fault direction would be considered to be in the reverse direction of the local relay 40.

Figure 9:
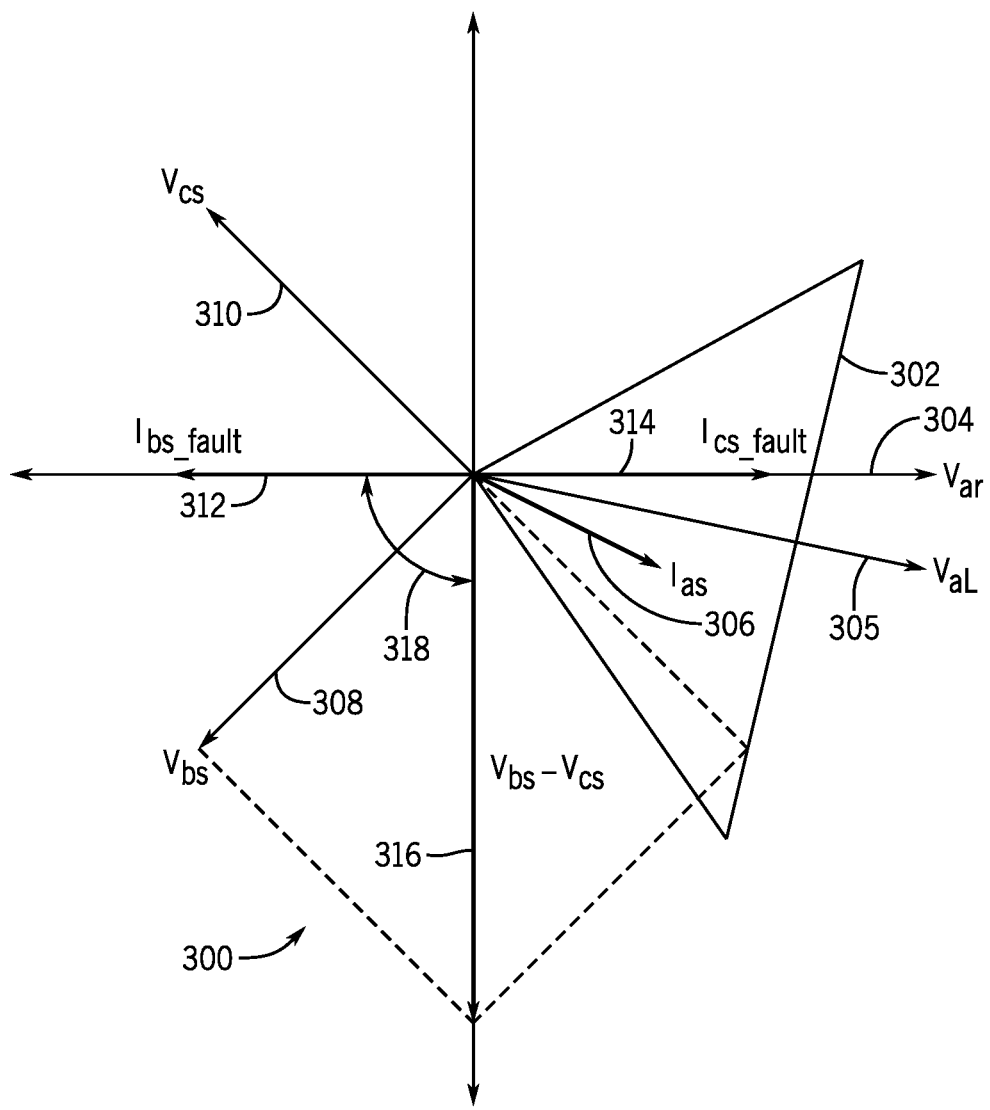
FIG. 9 is a graph with phasors for a forward BC fault in a three-phase power system with a forward pre-fault power flow, in accordance with an embodiment.

The foregoing contemplates faults which include two phases of the same line in a three-phase system. FIG. 9 illustrates a graph 300 with voltage and current phasors for a forward BC fault in a three-phase system for a forward power flow pre-fault. The graph 300 includes a load encroachment area 302 with regard to a remote relay voltage ($V_{aR}$) phasor 304 and/or a local relay voltage ($V_{aL}$) 305 for the A phase. The graph 300 also illustrates a current phasor 306 for the A phase, which indicates the pre-fault current. The graph 300 further illustrates a source voltage ($V_{BS}$) phasor 308 for the B phase and a source voltage ($V_{CS}$) phasor 310 for the C phase. The graph 300 also shows a fault current ($I_{bs\_fault}$) phasor 312 for the B phase and a fault current ($I_{cs\_fault}$) phasor 314 for the C phase. The graph 300 also depicts a voltage difference ($V_{bs}$–$V_{cs}$) phasor 316 as a difference between the source voltage phasor 308 and the source voltage phasor 310.

Using the graph 300, the source voltage for the B phase may be determined using Equation 1:

$$V_{bs}=I_{bs}Z_s+(I_{as}+I_{cs})Z_m+V_{bL} \quad \text{(Equation 1)},$$

where $V_{bs}$ is the source voltage for the B phase, $I_{bs}$ is the source current for the B phase, $Z_s$ is the self-impedance of the local source, $I_{cs}$ is the source current for the C phase, $Z_m$ is the mutual impedance among the phases of the local source, and $V_{bL}$ is the voltage measured at the local relay 40 for the B phase.

The source voltage for the C phase may be determined using Equation 2:

$$V_{cs}=I_{cs}Z_s+(I_{as}+I_{bs})Z_m+V_{cL} \quad \text{(Equation 2)},$$

where $V_{cs}$ is the source voltage for the C phase, $I_{as}$ is the source current for the A phase, and $V_{cL}$ is the voltage measured at the local relay 40 for the C phase. Subtracting Equation 2 from Equation 1 after replacing $I_{cs}$ with −$I_{bs}$ results in Equation 3:

$$V_{bs}-V_{cs}=2I_{bs}Z_s-2I_{bs}Z_m+V_{bL}-V_{cL} \quad \text{(Equation 3)}.$$

Assuming that the system is homogenous, the angle of the self and mutual impedances from the local relay to the fault point 80A would be same as $Z_s$ and $Z_m$, respectively. $V_{bL}$ may be replaced with $2sI_{bs}Z_s$ and $V_{cL}$ may be replaced with $-2sI_{bs}Z_m$, where 's' is the magnitude multiplier to $Z_s$ and $Z_m$. Replacing $V_{bL}$ with $2sI_{bs}Z_s$ and replacing $V_{cL}$ with $2sI_{bs}Z_m$ results in Equation 4:

$$V_{bs}-V_{cs}=2I_{bs}Z_s-2I_{bs}Z_m-2sI_{bs}Z_s-2sI_{bs}Z_m \quad \text{(Equation 4)}.$$

From Equation (4), it can be said that the angle of the fault current phasor 312 for the B phase lags the voltage difference phasor 316 by the positive system impedance angle 318, the angle of the fault current 312 phasor may be found using Equation 5:

$$\angle I_{bs}=\angle(V_{bs}-V_{cs})-\angle Z_1 \quad \text{(Equation 5)},$$

where $\angle Z_1$ is the positive sequence system impedance angle 318.

From Equation 5 and as previously noted, phase B's fault current phasor 312 lags the voltage difference phasor 316 ($V_{bs}$–$V_{cs}$) by the positive sequence system impedance angle 318, from source to the fault 80A. Using this information and the graph 300, the fault current phasor 312 ($I_{bs}$) lies almost opposite to the source voltage phasor 304 ($V_{as}$).

Thus, for a forward BC fault with forward pre-fault power flow direction, the relative difference in angles between current phasor 306 and the fault current phasor 312, $I_{bs}$, would always be more than 90°. Similarly, since the fault current phasors 312 and 314 are 180° apart, the relative angle difference between the current phasor 306 and the fault current phasor 314 would be less than 90°. For reverse faults with forward power flow, the relative difference in angles between current phasor 306 and the fault current phasor 314 would always be more than 90°. Similarly, since the fault current phasors 312 and 314 are 180° apart, the relative angle difference between the current phasor 306 and the fault current phasor 312 would be less than 90°.

Figure 10:
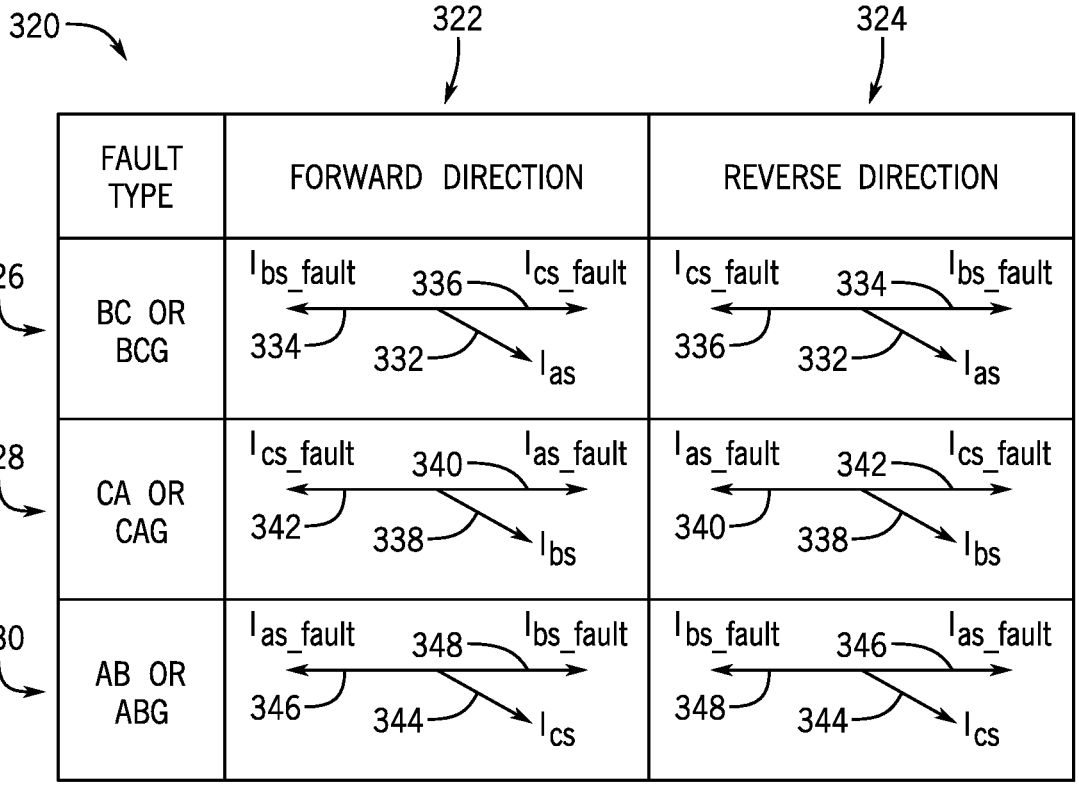
FIG. 10 is a diagram of forward and reverse BC, CA, or AB faults with respect to a non-faulted phasor with pre-fault forward power flow, in accordance with an embodiment.

Similarly, we can derive the current phasors for forward and reverse faults with either forward and reverse power flow prior to the fault. FIG. 10 illustrates a diagram 320 of forward and reverse faults with respect to a non-faulted phasor with pre-fault forward power flows. Specifically, the diagram 320 includes a forward column 322 that corresponds to forward faults and a reverse column 324 that corresponds to reverse faults. The diagram 320 also includes a BC row 326 that corresponds to a BC line-to-line fault or a BCG double-line-to-ground fault. The diagram 320 also includes a CA row 328 that corresponds to a CA line-to-line fault or a CAG double-line-to-ground fault. The diagram 320 also includes an AB row 330 that corresponds to an AB line-to-line fault or an ABG double-line-to-ground fault.

As illustrated, a forward BC fault in the BC row 326 and the forward column 322 includes a non-faulted A current phasor 332 and faulted B current phasor 334 and C current phasor 336. As previously discussed, the A current phasor 332 is within 90° of the C current phasor 336 and more than 90° away from the B current phasor 334. This relationship is reversed in a reverse fault situation as illustrated in the reverse column 324. For instance, in the BC row 326 and the reverse column 324, the A current phasor 332 is within 90° of the B current phasor 334 and more than 90° away from the C current phasor 336.

Similarly, in the CA row 328 and the forward column 322 corresponding to a forward fault, a non-faulted B current phasor 338 is within 90° of an A current phasor 340 but more than 90° away from a C current phasor 342. Inversely, in the CA row 328 and the reverse column 324 corresponding to a reverse fault, the B current phasor 338 is within 90° of the C current phasor 342 but more than 90° away from the A current phasor 340.

Similarly, in the AB row 330 and the forward column 322 corresponding to a forward fault, a non-faulted C current phasor 344 is more than 90° away from an A current phasor 346 but less than 90° away from a B current phasor 348. Inversely, in the AB row 330 and the reverse column 324 corresponding to a reverse fault, the C current phasor 344 is less than 90° away from the A current phasor 346 but more than 90° away from the B current phasor 348.

Figure 11:
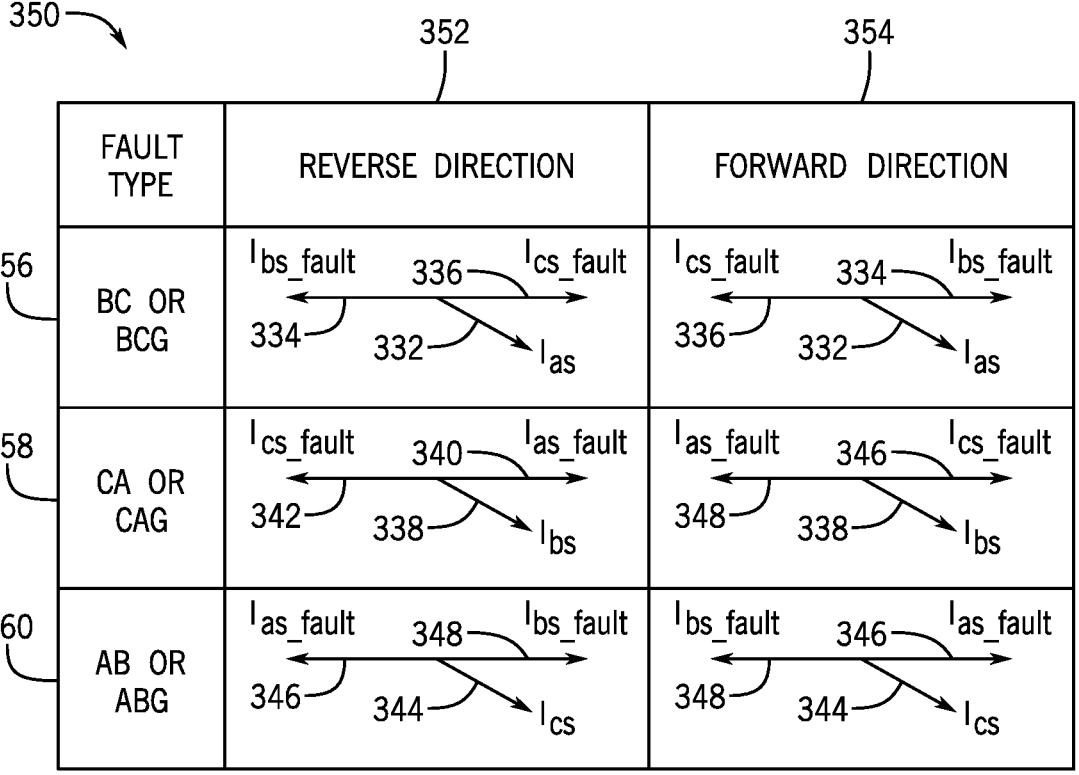
FIG. 11 is a diagram of forward and reverse BC, CA, or AB faults with respect to a non-faulted phasor with pre-fault reverse power flow, in accordance with an embodiment.

FIG. 11 illustrates a diagram 350 of forward and reverse faults with respect to a non-faulted phasor with pre-fault reverse power flows. Specifically, the diagram 350 includes a reverse column 352 that corresponds to reverse faults and a forward column 354 that corresponds to forward faults. The diagram 350 also includes a BC row 356 that corresponds to a BC line-to-line fault or a BCG double-line-to-ground fault. The diagram 350 also includes a CA row 358 that corresponds to a CA line-to-line fault or a CAG double-line-to-ground fault. The diagram 350 also includes an AB row 360 that corresponds to an AB line-to-line fault or an ABG double-line-to-ground fault.

As illustrated, the diagram 350 and the diagram 320 are the same except that forward and reverse faults are transposed. For example, the forward column 322 in the diagram 320 and the reverse column 352 in the diagram 350 are the same. Similarly, the reverse column 324 in the diagram 320 and the forward column 354 in the diagram 350 are the same. In other words, in the diagram 320 a single fault may be interpreted in one manner (e.g., forward fault) when the pre-fault condition included a forward flow while the same fault may interpreted in a different manner (e.g., reverse fault) using the diagram 350 when the pre-fault condition included a reverse flow.

FIG. 12 illustrates a phasor diagram 370 that corresponds to a captured field event. The local relay 40 (and/or a processor remote from the local relay 40) may obtain the data in the phasor diagram 370 to determine a type of fault and/or a direction of the fault. For example, if the direction of flow prior to the fault was reverse, the local relay 40 and/or remote processor may compare the phasor diagram 370 to the diagram 350 to determine a type of fault and/or the direction of the fault. As illustrated, the phasor diagram 370 includes an A current phasor 372, a B current phasor 374, and a C current phasor 376. Since the B current phasor 374 and the C current phasor 376 have about 180° difference between them, the fault 80 may involve B and C phases. The non-faulted A current phasor 372 is within 90° of the B current phasor 374 and more than 90° away from the C current phasor 376. Accordingly, according to the diagram 350, the BC line-to-line or double-line-to-ground fault may be deemed to be in a forward direction of the local relay 40. However, of the flow had been forward prior to the fault, the BC line-to-line or double-line-to-ground fault is in a reverse direction relative to the local relay 40.

FIG. 13 is a flow diagram of a process 400 for determining a fault direction for a for a power delivery system. The processor(s) 102 receive an indication of a pre-fault power flow direction for a power delivery system (block 402). Receiving the indication may include receiving an indication of a selection of a power flow direction setting (e.g., selection of a button or option by a user). Additionally or alternatively, the indication of the pre-fault power flow direction includes receiving the indication from an energy meter that indicates the pre-fault power flow direction. The processor(s) 102 then determines a fault direction by tracking the fault current vector angles and the pre-fault power flow direction (block 404). The fault may include a loss of potential condition on one or more phases of the power delivery system. For scenarios where one or two voltages are lost, virtual voltage phasors may be estimated for the lost ones using healthy phase voltages, as discussed below in relation to FIG. 15. Fault direction is then determined from the phase angle difference between the faulted phase or line current from its respective phase or line voltage. In some embodiments, the processor may calculate the phase angle difference using a point-on-the-waveform approach. For example, zero-crossings of the voltage and current waveforms may be compared to obtain the phase angle difference between current and voltage. Alternatively, phase angle difference may be calculated through the use of phasors of the voltage and the current.

When all three phase voltages are lost, the fault direction is determined by tracking the fault current phase vectors and by knowing the power flow direction prior to the fault, as previously discussed and discussed below in relation to FIG. 16. Determining the fault direction includes determining and tracking a difference between angles of one or more subsequent current vectors and a pre-fault current vector. In some embodiments, the processor(s) 102 may determine whether the difference falls in a forward fault region (e.g., forward fault ranges 222 or 242) or in a reverse fault region (e.g., reverse fault ranges 224 and 244).

FIG. 14 is a flow diagram of a process 410 for determining a fault direction and faults involving two phases. The process 410 includes the processor(s) 102 receiving an indication of a pre-fault power flow direction for a power transmission system (block 412). Receiving the indication may include receiving an indication of a selection of a direction setting (e.g., selection of a button or option by a user). Additionally or alternatively, the indication of the pre-fault power flow direction includes receiving the indication from an energy meter that indicates the pre-fault power flow direction. The processor(s) 102 determines a direction of a fault in the power delivery system based at least in part on the pre-fault power flow direction and comparing phasor angles of the phases relative to each other (block 414). The fault may include a line-to-line fault between two phases of the plurality of phases. Additionally or alternatively, the fault may include a double-line-to-ground fault with the two faulted phases tied to ground. The two faulted phases have current phasors about 180° apart.

Figure 15:
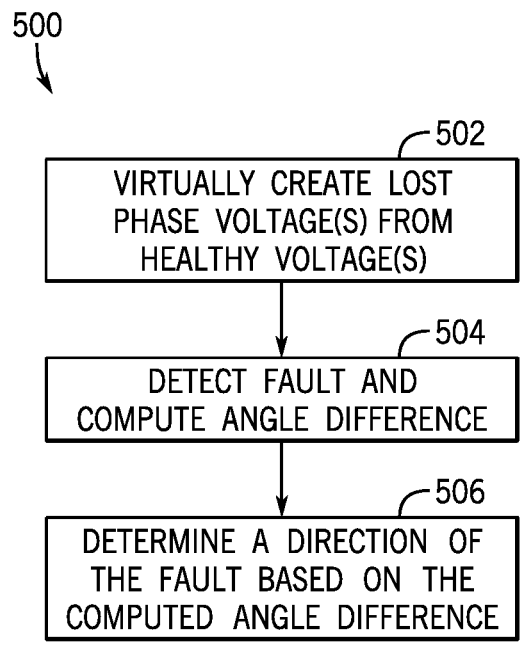
FIG. 15 is a flow diagram of a process for determining a fault direction when one or two voltages are lost, in accordance with an embodiment.

FIG. 15 is a flow diagram of a process 500 to be used when one or two voltages are lost at the local relay 40. In other words, the local relay 40 has at least one healthy phase voltage. Using the healthy phase voltage(s), the processor 102 may virtually create lost phase voltage(s) (block 502). In the case of a detected fault, the processor 102 computes an angle difference (block 504). After a period of time has elapsed since the beginning of the fault (e.g., one and a half (1.5) power system cycle), the processor 102 may compute the angle difference as 1) the angle difference between the faulty phase voltage and a phase current for a single-line-to-ground fault or 2) the angle difference between the faulty phase-to-phase voltage and phase-to-phase current for faults involving two phases. Using the computed angle difference, the processor 102 may determine a direction of the fault in accordance with the disclosed techniques (block 506).

Figure 16:
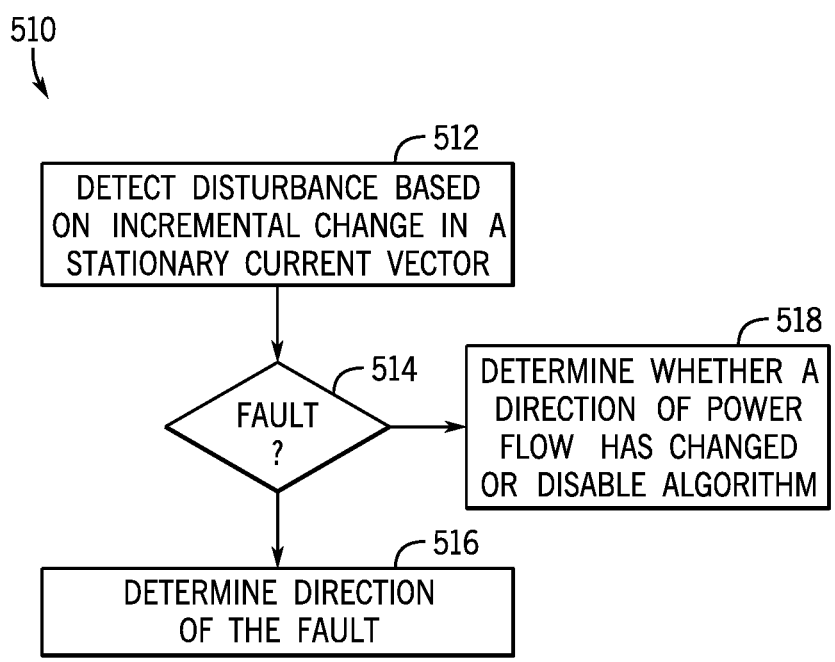
FIG. 16 is a flow diagram of a process for determining a fault direction when all voltages are lost and/or when a power flow direction has changed, in accordance with an embodiment.

FIG. 16 is a flow diagram of a process 510 to be used when the local relay 40 loses all three voltages with no voltage inputs. As previously discussed, the processor 102 may detect a disturbance based on an incremental change in the stationary current vector (block 512). The processor 102 determines whether the disturbance is a load change or a fault (block 514). For instance, magnitude of the phase current may be compared to a threshold value. When the magnitude of the phase current value exceeds the threshold, the disturbance is deemed to be a fault, and the processor 102 determines and/or declares the direction of the fault using the foregoing techniques (block 516). When the magnitude of the phase current does not exceed the threshold, the disturbance may be deemed to not be a fault. Instead, the processor 102 determines and/or declares that the disturbance is a load change that may potentially lead to a change in the power flow direction or disables the algorithm (block 518). For instance, if the cumulative angle change exceeds 180°−LEIA−LECA over a period of time, the processor 102 determines and/or declares the disturbance to be a change in power flow direction. If the cumulative angle change is less than LEIA+LECA, the processor 102 determines and/or declares that there has been no change in power flow direction. For all other cumulative angles, the processor 102 disables the algorithm as unable to designate the disturbance as related to a change in power flow direction or to designate the disturbance as a fault.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance delivery of high-voltage power. Accordingly, many changes may be made to the details of the above-described embodiments without departing from the underlying principles of this disclosure. The scope of the present invention should, therefore, be determined only by the following claims.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A method, comprising:
obtaining a pre-fault power flow direction for a power delivery system at an initial time; and
determining, via one or more processors, a fault direction during a fault for the power delivery system by determining whether current vector angles, calculated from a difference between a current phase angle before the fault and a current phase angle during the fault, fall within a forward fault phase angle range or a reverse fault phase angle range, wherein at least one of the forward fault phase angle range and the reverse fault phase angle range is determined based at least in part on the pre-fault power flow direction.

2. The method of claim 1, comprising receiving an indication of the pre-fault power flow direction, wherein receiving the indication of the pre-fault power flow direction comprises receiving an indication of a selection of a direction setting.

3. The method of claim 1, comprising receiving an indication of the pre-fault power flow direction, wherein receiving the indication of the pre-fault power flow direction comprises receiving the indication from an energy meter or incomer feeder that indicates the power flow direction at the initial time or from previously obtaining and tracking the power flow direction.

4. The method of claim 1, wherein the fault comprises a loss of potential in one or two phases for the power delivery system.

5. The method of claim 4, comprising using a healthy phase voltage to virtually create the one or two phases for the power delivery system.

6. The method of claim 5, wherein determining the fault direction is based at least in part on a phase angle difference between the faulted phase voltage and corresponding phase current for a single-line-to-ground fault or three-phase fault or based at least in part on an angle difference between a faulty phase-to-phase voltage and corresponding phase-to-phase current for faults involving two phases and/or ground.

7. The method of claim 1, comprising determining the fault direction based at least in part on a phase angle difference using a point-on-the-waveform approach.

8. The method of claim 1, wherein the loss of potential comprises a loss of potential in all three phases of the power delivery system.

9. The method of claim 1, wherein a sum of a load encroachment inductive angle of the power delivery system and a load encroachment capacitive angle of the power delivery system is less than or equal to a set number; and the load encroachment inductive angle is less than a difference of half of a maximum angle difference between a source generator and a remote generator and the set number.

10. The method of claim 1, wherein determining the fault direction comprises determining a difference between angles of one or more subsequent current vectors and a pre-fault current vector.

11. The method of claim 10, wherein the forward fault phase angle range corresponds to the fault being in a forward direction of a relay of the power delivery system, and the reverse fault phase angle range corresponds to the fault being in a reverse direction of the relay of the power delivery system.

12. A power delivery system, comprising:
one or more current transformers each coupled to one of one or more phases of a power delivery system; and
one or more processors configured to:
determine a disturbance based on an incremental change in a stationary current vector for the one or more current transformers;
compute a cumulative angle change in the phase current for a period of time;
determine whether the phase or sequence current magnitude exceeds a threshold; and
when the phase or sequence current magnitude exceeds the threshold, determine that the disturbance is a fault and determine a direction of the fault based at least in part on the cumulative angle change and a pre-fault current vector during a loss of potential in all phases of the power delivery system, and when the phase or sequence current magnitude does not exceed the threshold, determine whether the disturbance corresponds to a change in power flow direction based at least in part on the cumulative angle change.

13. The power delivery system of claim 12, wherein when the phase or sequence current magnitude does not exceed the threshold and the cumulative angle change is greater than 180° minus a load encroachment capacitance angle (LECA) for the power delivery system and minus a load encroachment inductive angle (LEIA) for the power delivery system, the one or more processors are configured to determine that the disturbance corresponds to change in power flow direction rather than to the fault.

14. The power delivery system of claim 12, wherein when the phase or sequence current magnitude does not exceed the threshold and the cumulative angle change is less than a load encroachment capacitance angle (LECA) of the power delivery system plus a load encroachment inductive angle (LEIA) of the power delivery system, the one or more processors are configured to determine that the disturbance corresponds to no change in power flow direction rather than a fault.

15. The power delivery system of claim 12, wherein when the phase or sequence current magnitude does not exceed the threshold and the cumulative angle change is between a first value and a second value, the one or more processors determines that a direction of the power flow is not determinable, wherein the first value is 180° minus a load encroachment capacitance angle (LECA) for the power delivery system and minus a load encroachment inductive angle (LEIA) for the power delivery system and the second value is the LECA plus the LEIA.

16. The power delivery system of claim 12, wherein the period of time comprises one and half cycle power cycle of the power delivery system.

17. A method for detecting fault directions, comprising:
obtaining a pre-fault power flow direction for a power delivery system having a plurality of phases; and
determining a direction of a fault in the power delivery system based at least in part on the pre-fault power flow direction and a comparison of phasor angles of the plurality of phases relative to each other.

18. The method of claim 17, wherein the fault comprises a line-to-line fault between at least two faulted phases of the plurality of phases or a double-line-to-ground faults of the at least two faulted phases of the plurality of phases tied to ground.

19. The method of claim 17, wherein obtaining the pre-fault power flow direction comprises using a healthy voltage phase to determine the pre-fault power flow direction when only one or two phase voltages are lost.

20. The method of claim 17, comprising receiving a known power flow direction, wherein obtaining the pre-fault power flow direction comprises tracking changes in power flow direction after the known power flow direction.

21. The method of claim 17, wherein the comparison of the phasor angles comprises determining an angle difference between a fault phase voltage and a phase current for a single-line-to-ground fault or three-phase fault.

22. The method of claim 17, wherein the comparison of the phase angles comprises determining an angle difference between a faulty phase-to-phase voltage and a phase-to-phase current for faults involving two of the plurality of phases.

23. The method of claim 17, comprising controlling operation of a circuit breaker based at least in part on the direction of the fault relative to a relay of the power delivery system.

* * * * *